United States Patent
Jeong et al.

(10) Patent No.: US 9,015,463 B2
(45) Date of Patent: *Apr. 21, 2015

(54) MEMORY DEVICE, MEMORY SYSTEM INCLUDING A NON-VOLATILE MEMORY CONFIGURED TO OUTPUT A REPAIR DATA IN RESPONSE TO AN INITIALIZATION SIGNAL

(75) Inventors: Jeongsu Jeong, San Jose, CA (US); Youncheul Kim, San Jose, CA (US); Gwangyoung Stanley Jeong, San Jose, CA (US); Bokmoon Kang, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 294 days.

This patent is subject to a terminal disclaimer.

(21) Appl. No.: 13/601,629

(22) Filed: Aug. 31, 2012

(65) Prior Publication Data

US 2014/0068241 A1 Mar. 6, 2014

(51) Int. Cl.
| | | |
|---|---|---|
| G06F 15/177 | (2006.01) | |
| G06F 11/00 | (2006.01) | |
| G11C 16/20 | (2006.01) | |
| G11C 29/00 | (2006.01) | |
| G11C 7/20 | (2006.01) | |
| G11C 29/44 | (2006.01) | |

(52) U.S. Cl.
CPC *G11C 16/20* (2013.01); *G11C 7/20* (2013.01); *G11C 2029/4402* (2013.01); *G11C 29/82* (2013.01)

(58) Field of Classification Search
CPC ............................................ G06F 9/4401
USPC ............................................. 713/2
See application file for complete search history.

(56) References Cited

U.S. PATENT DOCUMENTS

| | | |
|---|---|---|
| 6,181,614 B1 * | 1/2001 | Aipperspach et al. ........ 365/200 |
| 6,667,902 B2 | 12/2003 | Peng |
| 6,777,757 B2 | 8/2004 | Peng et al. |
| 6,904,751 B2 | 6/2005 | Makki et al. |
| 7,173,851 B1 | 2/2007 | Callahan et al. |
| 7,269,047 B1 | 9/2007 | Fong et al. |
| 7,757,135 B2 * | 7/2010 | Nadeau-Dostie et al. .... 714/723 |
| 7,802,133 B2 * | 9/2010 | Lee et al. ..................... 714/6.13 |
| 8,468,401 B2 * | 6/2013 | Lee et al. ...................... 714/723 |
| 8,797,808 B2 * | 8/2014 | Jeong ....................... 365/189.05 |
| 2009/0006887 A1 * | 1/2009 | Lee et al. ........................... 714/5 |
| 2014/0022856 A1 * | 1/2014 | JUNG et al. .............. 365/189.12 |

* cited by examiner

*Primary Examiner* — Suresh Suryawanshi
(74) *Attorney, Agent, or Firm* — IP & T Group LLP

(57) ABSTRACT

A memory device includes a non-volatile memory configured to store a repair data and output the repair data in response to an initialization signal, a plurality of registers configured to store the repair data outputted from the non-volatile memory, a plurality of memory banks configured to replace normal cells with redundant cells by using the repair data stored in corresponding registers among the plurality of registers, a verification circuit configured to generate a completion signal for informing that transfer of the repair data from the non-volatile memory to the plurality of registers is completed, and an output circuit configured to output the completion signal to a device other than the memory device.

12 Claims, 5 Drawing Sheets

MEMORY DEVICE, MEMORY SYSTEM INCLUDING A NON-VOLATILE MEMORY CONFIGURED TO OUTPUT A REPAIR DATA IN RESPONSE TO AN INITIALIZATION SIGNAL

BACKGROUND

1. Field

Exemplary embodiments of the present invention relate to a memory device, and more particularly, to a technology for transferring data stored in a non-volatile memory in a memory device to other regions of the memory device.

2. Description of the Related Art

FIG. 1 is a block view illustrating a repair operation of a conventional memory device.

Referring to FIG. 1, the memory device includes a cell array 110 including a plurality of memory cells, a row circuit 120 for enabling a selected word line that is selected based on a row address R_ADD, and a column circuit 130 for accessing (which means reading or writing) the data of a selected bit line that is selected based on a column address C_ADD.

A row fuse circuit 140 may store a row address corresponding to a failed memory cell of the cell array 110 as a repair row address REPAIR_R_ADD. A row comparison circuit 150 may compare the repair row address REPAIR_R_ADD stored in the row fuse circuit 140 with the row address R_ADD inputted from the source other than the memory device. If the repair row address REPAIR_R_ADD and the row address R_ADD are the same, the row comparison circuit 150 may control the row circuit 120 to enable a redundancy word line instead of the word line designated by the row address R_ADD.

A column fuse circuit 160 may store a column address corresponding to a failure memory cell of the cell array 110 as a repair column address REPAIR_C_ADD. A column comparison circuit 170 may compare the repair column address REPAIR_C_ADD stored in the column fuse circuit 160 with a column address C_ADD inputted from the source other than the memory device. If the repair column address REPAIR_C_ADD and the column address C_ADD are the same, the column comparison circuit 170 may control the column circuit 130 to enable a redundant bit line instead of the bit line designated by the column address C_ADD.

The row fuse circuit 140 and the column fuse circuit 160 use laser fuses. The laser fuses may store data of a logical high level or a logical low level according to whether a fuse is cut or not. A laser fuse may be programmed in the stage of wafer, but it may not be programmed after the wafer is mounted in the inside of a package. Also, a size of laser fuse may not be reduced due to technical limitation in pitch. To overcome these concerns, an e-fuse is used. An e-fuse is formed of a transistor or a capacitor or a resistor, and an e-fuse may operate as a capacitor or a resistor. When an e-fuse is formed of a transistor, it may store a data by changing the resistance between a gate and a drain/source.

FIG. 2 is a schematic diagram illustrating an e-fuse formed of a transistor, which operates as a resistor or a capacitor.

Referring to FIG. 2, the e-fuse is formed of a transistor T, and when a low power source voltage that the transistor T may tolerate is supplied to the gate G, the e-fuse operates as a capacitor C. Therefore, no current flows between the gate G and the drain/source D/S. However, when a high power source voltage that the transistor T may not tolerate is supplied to the gate G, the gate oxide of the transistor T is destroyed to short the gate G and the drain/source D/S, and the e-fuse operates as a resistor R. Therefore, current flows between the gate G and the drain/source D/S.

Based on above results, the data of the e-fuse is recognized from the resistance value between the gate G and the drain/source D/S of the e-fuse. To recognize the data of the e-fuse, (1) the size of the transistor may be enlarged so that the data may be recognized without performing a sensing operation, or (2) an amplifier may be used to recognize the data of the e-fuse by sensing the current flowing through the transistor T instead of enlarging the size of the transistor T. These two methods have limitations in terms of area because the size of the transistor T constituting the e-fuse has to be enlarged or each e-fuse has to be provided with an amplifier for amplifying data.

It is not easy to apply the e-fuse to the row fuse circuit 140 and the column fuse circuit 160 of FIG. 1 due to the aforementioned problems. U.S. Pat. Nos. 6,904,751, 6,777,757, 6,667,902, 7,173,851 and 7,269,047 disclose a technology of forming an e-fuse in an array type and performing a repair operation using the data stored in the e-fuse array. When the e-fuse is formed in an array type, the total size may be reduced because components, such as an amplifier may be shared.

SUMMARY

In order to set up a non-volatile memory, such as an e-fuse array in a memory device, and use the data stored in the e-fuse array, such as a repair data, the data stored in the e-fuse array has to be transferred to regions of the memory device where the data stored in the e-fuse array are used. This operation is referred to as a boot-up operation. An exemplary embodiment of the present invention is directed to providing an efficient scheme for transferring the data stored in the e-fuse array to the regions in the memory device.

Another exemplary embodiment of the present invention is directed to a technology for informing a memory controller that the data stored in the e-fuse array is transferred to the regions in the memory device.

In accordance with an exemplary embodiment of the present invention, a memory device includes a non-volatile memory configured to store a repair data and output the repair data in response to an initialization signal, a plurality of registers configured to store the repair data outputted from the non-volatile memory, a plurality of memory banks configured to replace normal cells with redundant cells by using the repair data stored in corresponding registers among the plurality of registers, a verification circuit configured to generate a completion signal for informing that transfer of the repair data from the non-volatile memory to the plurality of registers is completed, and an output circuit configured to output the completion signal to a device other than the memory device.

In accordance with another exemplary embodiment of the present invention, a memory system includes a memory device, and a memory controller configured to apply an initialization signal to the memory device during an initialization operation, where the memory device includes a non-volatile memory configured to store a repair data and output the repair data in response to the initialization signal, a plurality of registers configured to store the repair data outputted from the non-volatile memory, a plurality of memory banks configured to replace normal cells with redundant cells by using the repair data stored in corresponding registers among the plurality of registers, a verification circuit configured to generate a completion signal for informing that transfer of the repair data from the non-volatile memory to the plurality of registers is completed, and an output circuit configured to output the completion signal to the memory controller.

In accordance with another exemplary embodiment of the present invention, a method for operating a memory system including a memory device and a memory controller includes applying an initialization signal from the memory controller to the memory device, performing a boot-up operation where a repair data is transferred from a non-volatile memory of the memory device to registers of the memory device in response to the initialization signal, transferring information that the boot-up operation is completed from the memory device to the memory controller, and applying a command from the memory controller to the memory device after the completion of the boot-up operation is informed to the memory controller.

DETAILED DESCRIPTION

Figure 1:
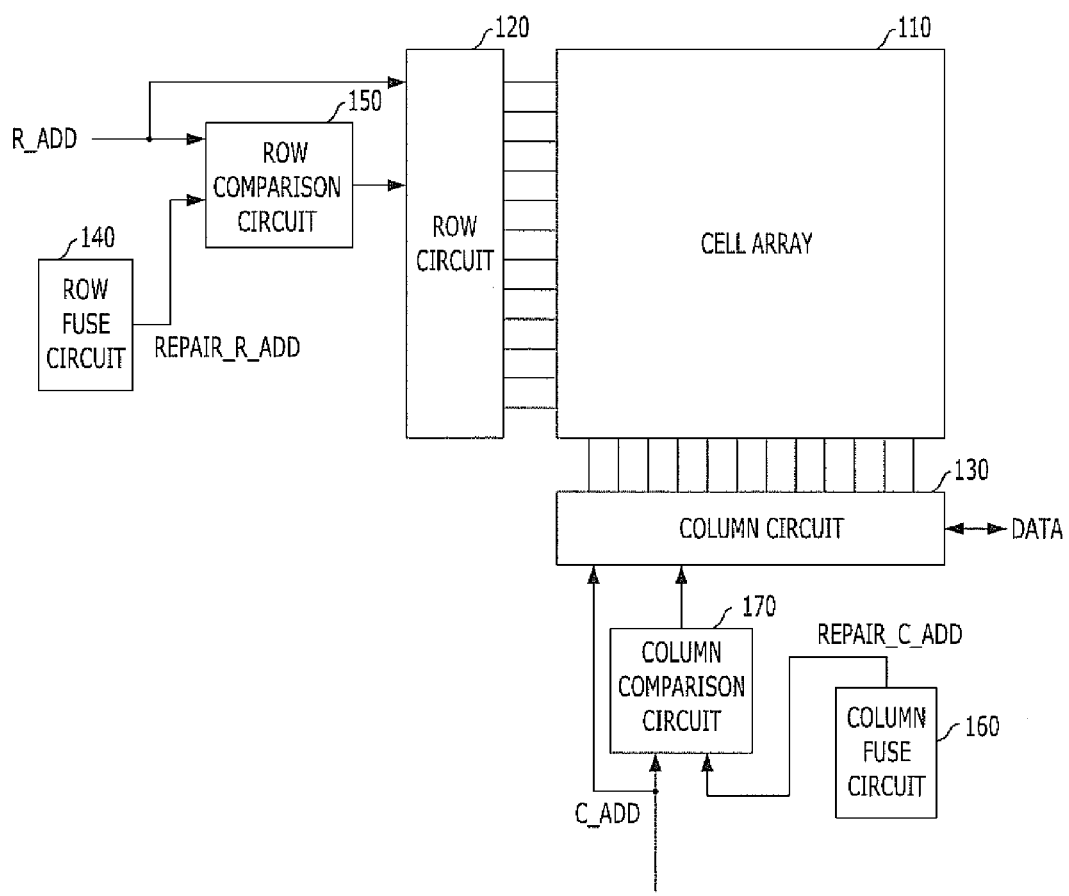
FIG. 1 is a block view illustrating a repair operation of a conventional memory device.
Figure 2:
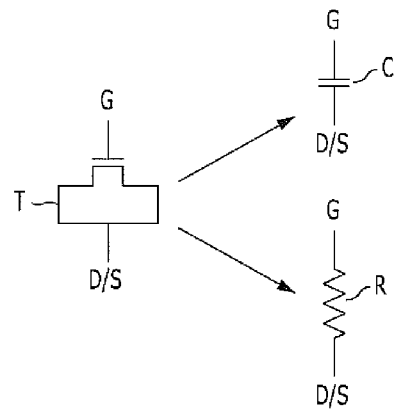
FIG. 2 is a schematic diagram illustrating an e-fuse formed of a transistor, which operates as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
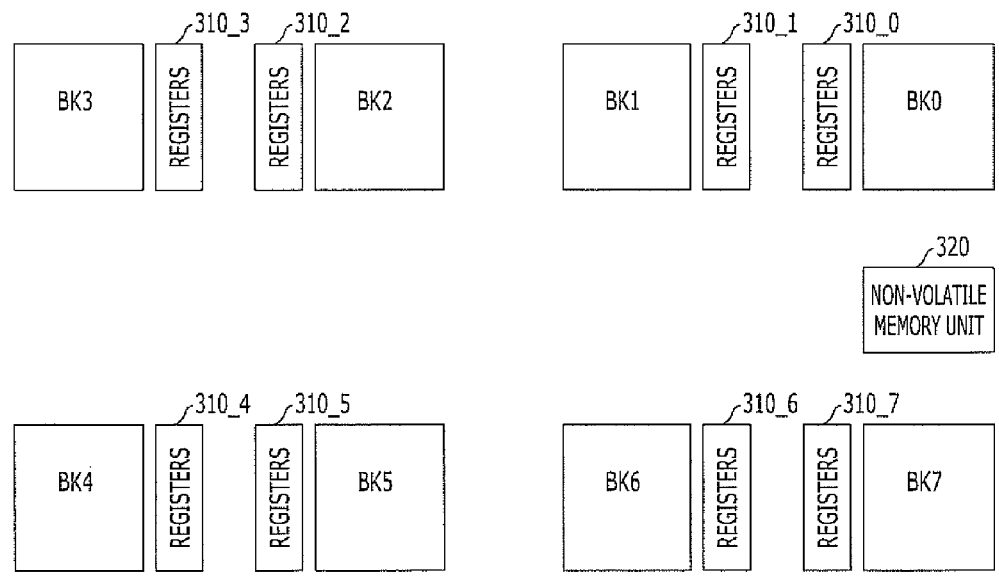
FIG. 3 is an illustration of a memory device including a non-volatile memory for storing a repair data.

FIG. 3 illustrates a memory device including a non-volatile memory for storing a repair data.

Referring to FIG. 3, the memory device includes a plurality of memory banks BK0 to BK7, registers 310_0 to 310_7, and a non-volatile memory 320. The registers 310_0 to 310_7 are included in the memory banks BK0 to BK7, respectively, and store a repair address.

The non-volatile memory 320 replaces the row fuse circuit 140 and the column fuse circuit 160 shown in FIG. 1. The non-volatile memory 320 stores repair data corresponding to all of the memory banks BK0 to BK7 that is a repair address. The non-volatile memory 320 may include an e-fuse array, or it may be formed of diverse kinds of non-volatile memories, such as a flash memory, Electrically Erasable Programmable Read Only Memory (EEPROM), and so forth.

The registers 310_0 to 310_7, which are included in the memory banks BK0 to BK7, respectively, store repair data of their corresponding memory banks BK0 to BK7. In other words, the register 310_0 stores a repair data of the memory bank BK0, and the register 310_4 stores a repair data of the memory bank BK4. The registers 310_0 to 310_7 receive and store repair data from the non-volatile memory 320 during the initialization operation of the memory device.

Because the non-volatile memory 320 is formed in an array type, it takes a predetermined time to call the data stored in the inside of the non-volatile memory 320. For this reason, it is difficult to perform a repair operation by directly using the data stored in the non-volatile memory 320. Therefore, the information stored in the non-volatile memory 320 are transferred to the registers 310_0 to 310_7, and the data stored in the registers 310_0 to 310_7 are used for a repair operation.

To transfer the data from the non-volatile memory 320 to the registers 310_0 to 310_7, an address for designating a register where the data is to be transferred among the registers 310_0 to 310_7 has to be transferred along with the data to be stored in the registers 310_0 to 310_7. Hereafter, a scheme based on an embodiment of the present invention that simplifies the data transfer is described.

Figure 4:
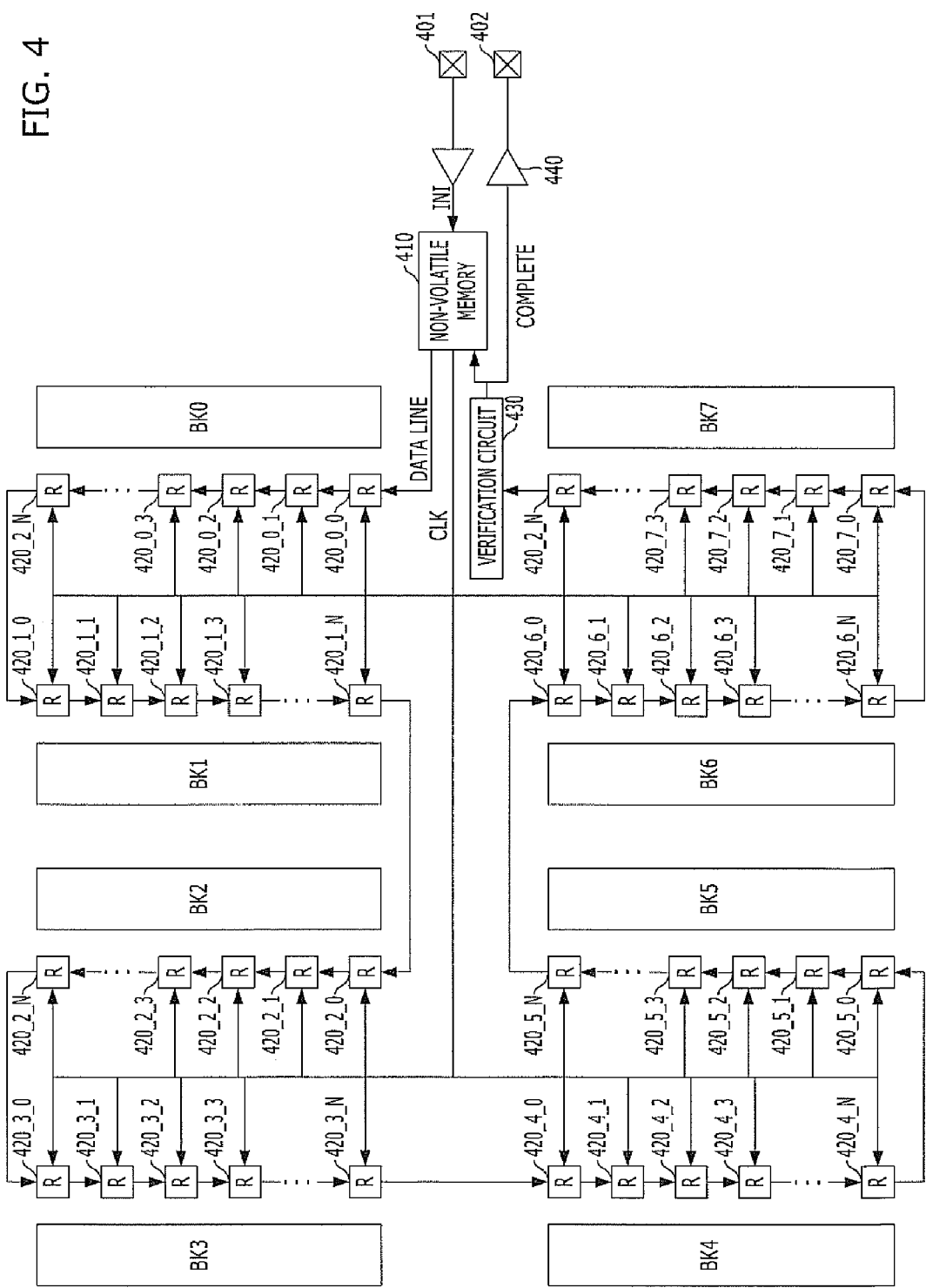
FIG. 4 is a block view of a memory device in accordance with an embodiment of the present invention.

FIG. 4 is a block view of a memory device in accordance with an embodiment of the present invention.

Referring to FIG. 4, the memory device includes a non-volatile memory 410, a plurality of registers 420_0_0 to 420_7_N, a plurality of memory banks BK0 to BK7, a verification circuit 430, and an output circuit 440.

The non-volatile memory 410 stores the addresses of failed cells that are repair data of the memory banks BK0 to BK7. The non-volatile memory 410 may transfer a data through a data line. The non-volatile memory 410 outputs a clock CLK, which is synchronized with the data of the data line. The non-volatile memory 410 may include an e-fuse array, or it may be formed of diverse kinds of non-volatile memories, such as a flash memory, Electrically Erasable Programmable Read Only Memory (EEPROM), and so forth. The non-volatile memory 410 begins to operate in response to an initialization signal INI. The initialization signal INI is inputted to the memory device through a pad 401, and enabled during an initialization operation of the memory device. Examples of the initialization signal INI include a reset signal RESET, and any signal that is enabled during the initialization operation of the memory device.

The registers 420_0_0 to 420_7_N store a repair data of corresponding memory banks. For example, the registers 420_1_0 to 420_1_N store a repair data of the first memory bank BK1, and the registers 420_5_0 to 420_5_N store a repair data of the fifth memory bank BK5. The registers 420_0_0 to 420_7_N are serially coupled with each other to form a shift register, and store the data transferred through the data line in synchronization with the clock CLK while shifting the data. For example, when the clock CLK toggles for the first time, the data that is transferred through the data line for the first time is stored in the register 420_0_0. When the clock CLK toggles for the second time, the data that is transferred through the data line for the first time, which is the data stored in the register 420_0_0, is stored in the register 420_0_1, and the data that is transferred through the data line for the second time is stored in the register 420_0_0. Each of the registers 420_0_0 to 420_7_N may be formed of a D-flipflop.

The memory banks BK0 to BK7 perform a repair operation of replacing a normal cell with a redundant cell by using the repair data stored in the corresponding registers 420_0_0 to 420_7_N. Each of the memory banks BK0 to BK7 may be formed of a Dynamic Random Access Memory (DRAM) cell array or a flash memory cell array.

The verification circuit 430 verifies whether the data outputted from the non-volatile memory 410 is stored in all of the registers 420_0_0 to 420_7_N or not. The data that may be stored in the multiple registers is not outputted from the non-volatile memory 410 during the initial stage, and a predetermined data pattern is transferred during the initial stage. For example, a predetermined 4-bit data pattern of '1010' may be transferred from the non-volatile memory 410. The verification circuit 430 receives a data outputted from the last register 420_7_N among the registers 420_0_0 to 420_7_N. The verification circuit 430 checks whether a predetermined data pattern is transferred from the last register 4207N and decide whether the data is transferred from the non-volatile memory 410 to all of the registers 420_0_0 to 420_7_N. When it is determined that the data is transferred from the non-volatile memory 410 to all of the registers 420_0_0 to 420_7_N, the verification circuit 430 generates a completion signal COMPLETE, and the output circuit 440 outputs the completion signal COMPLETE to a device other than the memory device, e.g., to a memory controller, through the pad 402. Also, the verification circuit 430 controls the clock CLK outputted from the non-volatile memory 410 to stop toggle from the moment when the completion signal COMPLETE is enabled by transferring the completion signal COMPLETE to the non-volatile memory 410.

Referring to FIG. 4, when the data of the non-volatile memory 410 is transferred to the registers 420_0_0 to 420_7_N, the clock CLK is transferred instead of an address, and the registers 420_0_0 to 420_7_N are coupled with each other as a shift register and may store the data outputted from the non-volatile memory 410 in synchronization with the clock CLK while shifting the data. For this reason, it does not have to transfer a multi-bit address from the non-volatile memory 410 to the registers 420_0_0 to 420_7_N, and this reduces the size of the memory device.

Also, the verification circuit 430 generates the completion signal COMPLETE informing that the data is transferred from the non-volatile memory 410 to all of the registers 420_0_0 to 420_7_N and the completion signal COMPLETE is transferred to the memory controller. Through the process, the memory controller may be informed of whether the boot-up operation of the memory device, which is an operation where the data is transferred from the non-volatile memory 410 to the registers 420_0_0 to 420_7_N, is completed or not.

Figure 5:
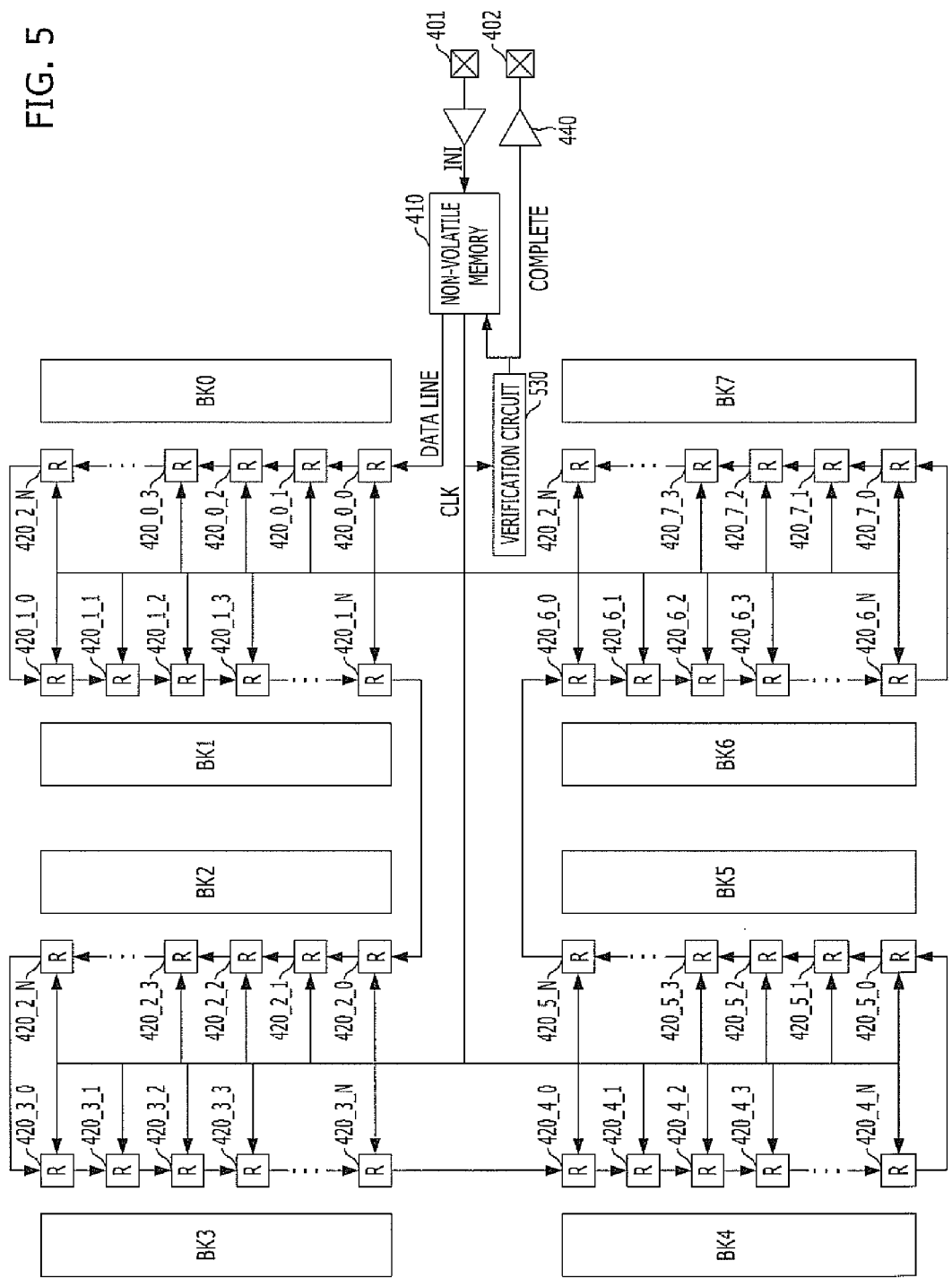
FIG. 5 is a block view of a memory device in accordance with another embodiment of the present invention.

FIG. 5 is a block view of a memory device in accordance with another embodiment of the present invention.

FIG. 5 describes a case where a completion signal COMPLETE is generated in a different method from that of FIG. 4.

Referring to FIG. 5, a verification circuit 530 generates a completion signal COMPLETE when a predetermined time, which is a time required to transfer a data from the non-volatile memory 410 to the registers 420_0_0 to 420_7_N elapsed from when the non-volatile memory 410 begins to operate. The verification circuit 530 may count the number of times that the clock CLK is enabled from a moment when an initialization signal INI is enabled to when the completion signal COMPLETE is generated when the count value reaches a predetermined value.

Figure 6:
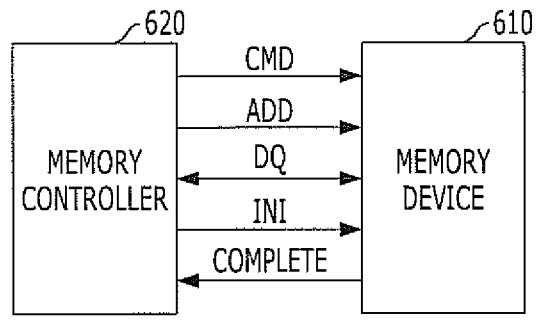
FIG. 6 is a block view of a memory system in accordance with another embodiment of the present invention.
Figure 7:
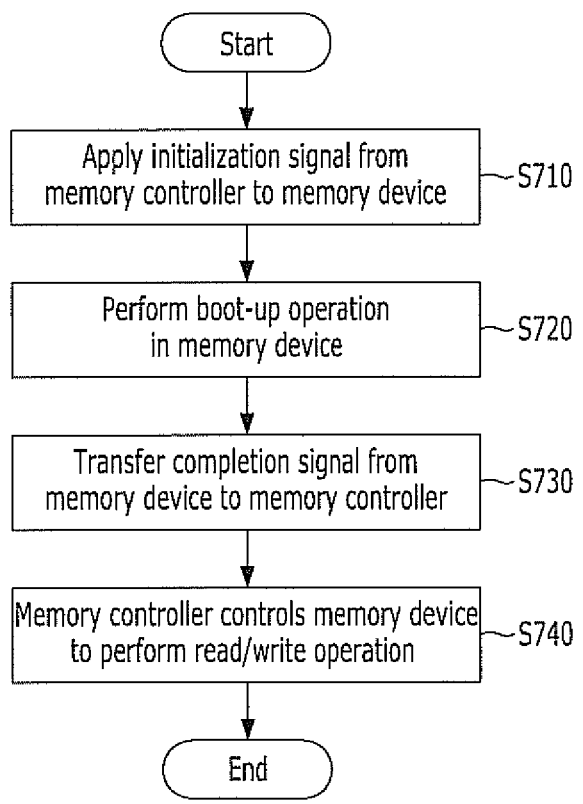
FIG. 7 is a flowchart describing the operation of the memory system shown in FIG. 6.

FIG. 6 is a block view of a memory system in accordance with another embodiment of the present invention. FIG. 7 is a flowchart describing the operation of the memory system shown in FIG. 6.

Referring to FIG. 6, the memory system includes a memory device 610 of FIG. 4 or 5 and a memory controller 620. Hereafter, the operation of the memory system is described with reference to FIGS. 6 and 7.

In step S710, the memory controller 620 generates an initialization signal INI, e.g., a reset signal, and applies the initialization signal INI to the memory device 610 before the memory device 610 performs a major operation, such as a read operation or a write operation.

In step S720, the memory device 610 performs a boot-up operation, which starts when the initialization signal INI is enabled. The boot-up operation is an operation that a repair data is transferred from the non-volatile memory 410 of the memory device 610 to the registers 420_0_0 to 420_7_N.

In step S730, when the boot-up operation of the memory device 610 is completed, the memory device 610 generates the completion signal COMPLETE and transfers the completion signal COMPLETE to the memory controller 620.

In step S740, after the memory controller 620 receives the completion signal COMPLETE from the memory device 610, the memory controller 620 applies a command CMD and an address ADD to the memory device 610 and transfers and receives a write data DQ or a read data DQ to and from the memory device 610. In other words, the memory controller 620 controls the memory device 610 to perform a read operation or a write operation when the memory controller 620 receives the completion signal COMPLETE from the memory device 610.

The memory device 610 using the non-volatile memory 410 may normally perform a read operation or a write operation after the boot-up operation. This is because failed cells of the memory banks BK0 to BK7 may be replaced with redundant cells only after the boot-up operation ends. However, there are many manufacturers for producing the memory device 610, and the amount of repair data stored in the non-volatile memory 410 is different based on each manufacturer. For example, the amount of repair data of a memory device produced by A manufacturer may be approximately 2 Mb, and the amount of repair data of a memory device produced by B manufacturer may be approximately 3 Mb. In this case, the memory device produced by the B manufacturer may require more time to perform a boot-up operation than the memory device produced by the A manufacturer.

In this embodiment of the present invention, the memory controller 620 is informed when the boot-up operation of the memory device 610 is completed. After the boot-up operation, the memory device 610 may normally perform a read operation or a write operation. Therefore, the memory controller provides a sufficient boot-up time based on the time taken for the boot-up operation in the memory device 610. For example, if the time taken for the boot-up operation in the memory device 610 is relatively lengthy, the memory controller 620 may give the memory device 610 a long boot-up time before the memory device 610 performs a read operation or a write operation. If the time taken for a boot-up operation in the memory device 610 is relatively short, the memory controller 620 may give the memory device 610 a short boot-up time before the memory device 610 performs a read operation or a write operation. In short, the memory controller 620 may optimize when the memory device 610 starts performing a read operation or a write operation.

According to an embodiment of the present invention, data are efficiently transferred from a non-volatile memory of a memory device to other regions of the memory device that require the data of the non-volatile memory.

Also, because the memory device informs a memory controller of whether a boot-up operation is completed or not, boot-up time may be sufficiently secured and may not be wasted.

While the present invention has been described with respect to the specific embodiments, it will be apparent to those skilled in the art that various changes and modifications may be made without departing from the spirit and scope of the invention as defined in the following claims.

What is claimed is:
1. A memory device, comprising:
    a non-volatile memory configured to store a repair data and output the repair data in response to an initialization signal;

a plurality of registers configured to store the repair data outputted from the non-volatile memory;

a plurality of memory banks configured to replace normal cells with redundant cells by using the repair data stored in corresponding registers among the plurality of registers;

a verification circuit configured to generate a completion signal for informing that transfer of the repair data from the non-volatile memory to the plurality of registers is completed; and an output circuit configured to output the completion signal to a device other than the memory device.

2. The memory device of claim 1, wherein the plurality of registers are coupled with each other to form a shift register, and store the repair data outputted from the non-volatile memory in synchronization with a clock while shifting the repair data.

3. The memory device of claim 2, wherein a predetermined data pattern is transferred from the non-volatile memory in an initial stage, and the verification circuit checks whether the predetermined data pattern is outputted from a last register among the plurality of registers that are coupled with each other in a form of the shift register, and generates the completion signal.

4. The memory device of claim 1, wherein the verification circuit generates the completion signal after a predetermined time elapses from when the initialization signal is enabled.

5. A memory system, comprising:
a memory device; and
a memory controller configured to apply an initialization signal to the memory device during an initialization operation,
wherein the memory device comprises:
   a non-volatile memory configured to store a repair data and output the repair data in response to the initialization signal;
   a plurality of registers configured to store the repair data outputted from the non-volatile memory;
   a plurality of memory banks configured to replace normal cells with redundant cells by using the repair data stored in corresponding registers among the plurality of registers;
   a verification circuit configured to generate a completion signal for informing that transfer of the repair data from the non-volatile memory to the plurality of registers is completed; and
   an output circuit configured to output the completion signal to the memory controller.

6. The memory system of claim 5, wherein the memory controller applies a command to the memory device after the memory controller receives the completion signal from the memory device.

7. The memory system of claim 5, wherein the plurality of registers are coupled with each other to form a shift register, and store the repair data outputted from the non-volatile memory in synchronization with a clock while shifting the repair data.

8. The memory system of claim 7, wherein a predetermined data pattern is transferred from the non-volatile memory in an initial stage, and the verification circuit checks whether the predetermined data pattern is outputted from a last register among the plurality of registers that are coupled with each other in a form of the shift register, and generates the completion signal.

9. The memory system of claim 5, wherein the verification circuit enables the completion signal after a predetermined time elapses from when the initialization signal is enabled.

10. A method for operating a memory system including a memory device and a memory controller, comprising:
applying an initialization signal from the memory controller to the memory device;
performing a boot-up operation where a repair data is transferred from a non-volatile memory of the memory device to registers of the memory device in response to the initialization signal;
transferring information that the boot-up operation is completed, from the memory device to the memory controller; and
applying a command from the memory controller to the memory device after the completion of the boot-up operation is informed to the memory controller.

11. The method of claim 10, wherein the transferring of the information that the boot-up operation is completed includes:
checking out whether the repair data is transferred to the registers; and
informing the memory controller of the completion of the boot-up operation after the repair data is determined to be transferred to the registers.

12. The method of claim 10, wherein the transferring of the information that the boot-up operation is completed includes:
counting the number of times that a clock is enabled from a moment when the initialization signal is enabled;
informing the memory controller of the completion of the boot-up operation, when the number of times that a clock is enabled reaches a predetermined number.

* * * * *